United States Patent
Jeon et al.

(10) Patent No.: US 8,456,919 B1
(45) Date of Patent: Jun. 4, 2013

(54) METHOD AND APPARATUS TO PROVIDE DATA INCLUDING HARD BIT DATA AND SOFT BIT DATA TO A RANK MODULATION DECODER

(75) Inventors: Seungjune Jeon, Milpitas, CA (US); Sergey Anatolievich Gorobets, Edinburgh (GB)

(73) Assignee: Sandisk Technologies Inc., Plano, TX (US)

( * ) Notice: Subject to any disclaimer, the term of this patent is extended or adjusted under 35 U.S.C. 154(b) by 0 days.

(21) Appl. No.: 13/293,988

(22) Filed: Nov. 10, 2011

(51) Int. Cl.
*G11C 11/34* (2006.01)

(52) U.S. Cl.
USPC .......... 365/185.24; 365/185.03; 714/760; 714/767; 714/755; 714/763; 714/773

(58) Field of Classification Search
USPC .......... 365/185.24, 185.03; 714/760, 767, 714/755, 763, 773
See application file for complete search history.

(56) References Cited

U.S. PATENT DOCUMENTS

| | | | |
|---|---|---|---|
| 7,127,009 B2 | 10/2006 | Berthet et al. | |
| 7,656,706 B2 * | 2/2010 | Jiang et al. | 365/185.03 |
| 7,769,050 B2 | 8/2010 | Scherzer et al. | |
| 7,844,879 B2 * | 11/2010 | Ramamoorthy et al. | 714/763 |
| 7,904,783 B2 * | 3/2011 | Brandman et al. | 714/755 |
| 8,208,304 B2 * | 6/2012 | Shalvi et al. | 365/185.12 |
| 8,209,588 B2 * | 6/2012 | Perlmutter et al. | 714/773 |
| 8,225,180 B2 * | 7/2012 | Jiang et al. | 714/773 |
| 8,228,701 B2 * | 7/2012 | Sokolov et al. | 365/45 |
| 8,245,094 B2 * | 8/2012 | Jiang et al. | 714/752 |
| 2009/0132758 A1 | 5/2009 | Jiang et al. | |
| 2009/0132895 A1 | 5/2009 | Jiang et al. | |
| 2011/0296274 A1 * | 12/2011 | Mittelholzer et al. | 714/755 |

FOREIGN PATENT DOCUMENTS

| | | | |
|---|---|---|---|
| WO | 2008075351 A2 | 6/2008 | |
| WO | 2009067624 A1 | 5/2009 | |
| WO | 2009067633 A1 | 5/2009 | |

OTHER PUBLICATIONS

Jiang, Anxiao et al. "Rank Modulation for Flash Memories," IEEE Transactions on Information Theory, vol. 55, No. 6, Jun. 2009, pp. 2659-2673.
Zhang, Fan et al. "LDPC Codes for Rank Modulation in Flash Memories", ISIT 2010, Austin, Texas, Jun. 2010, IEEE, pp. 859-863.
Barg, Alexander et al. "Codes in Permutations and Error Correction for Rank Modulation," IEEE Transactions on Information Theory, vol. 56, No. 7, Jul. 2010, pp. 3158-3165.
Jiang, Anxiao et al. "Correcting Charge-Constrained Errors in the Rank-Modulation Scheme," IEEE Transactions on Information Theory, vol. 56, No. 5, May 2010, pp. 2112-2120.
Tamo, Itzhak et al. "Correcting Limited-Magnitude Errors in the Rank-Modulation Scheme," IEEE Transactions on Information Theory, vol. 56, No. 6, Jun. 2010, pp. 2551-2560.
The International Search Report and Written Opinion mailed Feb. 28, 2013 in International Application No. PCT/US2012/063086, 14 pages.

* cited by examiner

*Primary Examiner* — Viet Q Nguyen
(74) *Attorney, Agent, or Firm* — Toler Law Group, PC (57) ABSTRACT

A method includes providing data including hard bit data and soft bit data to a rank modulation decoder.

18 Claims, 9 Drawing Sheets

METHOD AND APPARATUS TO PROVIDE DATA INCLUDING HARD BIT DATA AND SOFT BIT DATA TO A RANK MODULATION DECODER

FIELD OF THE DISCLOSURE

The present disclosure is generally related to decoding data at a rank modulation decoder.

BACKGROUND

Non-volatile memory devices, such as universal serial bus (USB) flash memory devices or removable storage cards, have allowed for increased portability of data and software applications. Flash memory devices can enhance data storage density by storing multiple bits in each flash memory cell. For example, Multi-Level Cell (MLC) flash memory devices provide increased storage density by storing 3 bits per cell, 4 bits per cell, or more.

Storing multiple bits of information in a single flash memory cell typically includes mapping sequences of bits to states of the flash memory cell. For example, a first sequence of bits "110" may correspond to a first state of a flash memory cell and a second sequence of bits "010" may correspond to a second state of the flash memory cell. After determining that a sequence of bits is to be stored into a particular flash memory cell, the flash memory cell may be programmed to a state that corresponds to the sequence of bits.

Alternatively, multiple bits of information in a single flash memory cell may be stored as relative voltage levels of multiple cells of the memory rather than as absolute voltage levels in each cell. For example, each storage element of the memory may have a threshold voltage corresponding to a state of the storage element. A group of storage elements may store data based on relative threshold voltages of the storage elements in the group. Data may be read from the group of storage elements by ranking the storage elements according to threshold voltages and mapping the ranking to a corresponding data value at a rank modulation decoder.

Once the memory cells in the memory device have been programmed, data may be read from the memory cells by sensing the programming states of the memory cells. However, sensed programming states can sometimes vary from the written programming states due to one or more factors. Error correction decoding can be used to correct data errors resulting from sensed programming states that do not match written programming states.

SUMMARY

Improved error correction capability of a rank modulation decoder may be achieved by decoding data using soft bits and hard bits. To illustrate, soft bits and hard bits may be used as an input to a rank modulation decoder to enhance error correction capability in a multi-level-cell (MLC) memory system, as compared to a decoding scheme that is based on using hard bits only as an input to the rank modulation decoder.

DETAILED DESCRIPTION

Decoding techniques may provide improved error correction as data storage device dimensions decrease and storage density increases. Using soft bits and hard bits as an input to a rank modulation decoder in multi-level-cell (MLC) memory systems can enhance error correction capability.

Systems and methods of providing data including hard bit data and soft bit data to a rank modulation decoder include a capability to provide data including hard bit data and soft bit data read from a memory of a data storage device to the rank modulation decoder.

Figure 1:
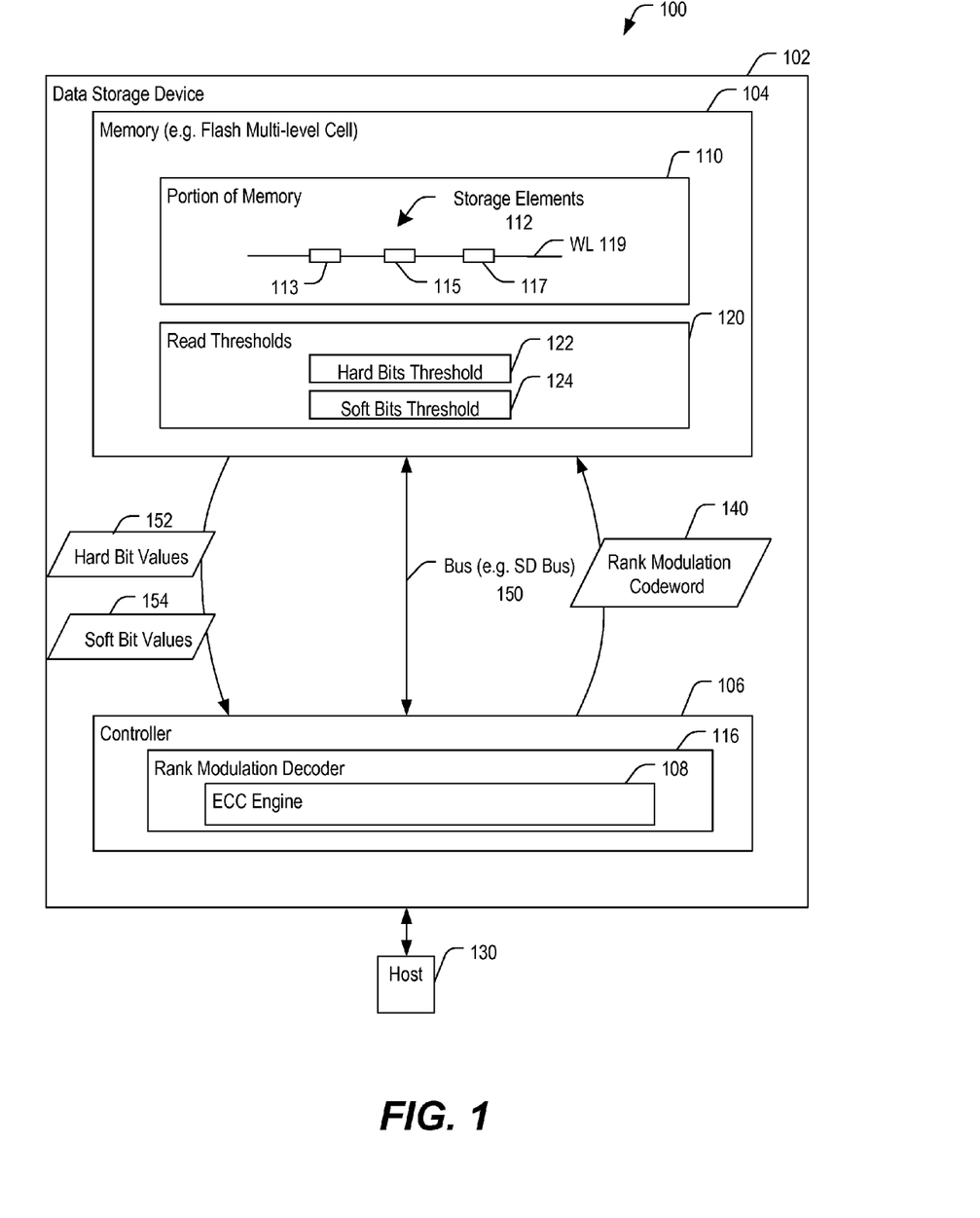
FIG. 1 is a block diagram of a first illustrative embodiment of a system that provides data including hard bit data and soft bit data to a rank modulation decoder.

Referring to FIG. 1, a particular illustrative embodiment of a system of providing data including hard bit data and soft bit data to a rank modulation decoder is depicted and generally designated 100. The system 100 includes a data storage device 102 coupled to a host device 130. The data storage device 102 includes a memory 104 coupled to a controller 106 via a bus 150.

The data storage device 102 may be a memory card, such as a Secure Digital SD® card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). As another example, the data storage device 102 may be embedded memory in the host device 130, such as eMMC® (trademark of JEDEC Solid State Technology Association, Arlington, Va.) memory and eSD memory, as illustrative examples.

The memory 104 may be a non-volatile memory of a flash device, such as a NAND flash device, a NOR flash device, or any other type of flash device. The memory 104 includes a memory portion 110 and read thresholds 120. The memory portion 110 includes a plurality of storage elements, such as memory cells of a multi-level cell (MLC) memory. A group of storage elements 112 may include multiple MLC storage elements, such as representative storage elements 113, 115, 117 of a word line 119 of a flash memory device. Each storage element 113-117 may have a threshold voltage corresponding to a state of the storage element (e.g., a predefined state corresponding to a particular range of threshold voltage values). The group of storage elements 112 may store data based on relative threshold voltages (or states) of the storage elements 113-117. The states of the storage elements 113-117 may be read by comparing the threshold voltages to one or more of the read thresholds 120.

The read thresholds 120 include a hard bits threshold 122 and a soft bits threshold 124. As described in further detail with respect to FIG. 3, the hard bits threshold 122 may include threshold read voltages for hard bits (e.g., voltages AR, BR, . . . GR in FIG. 3) and the soft bits threshold 124 may include threshold read voltages for additional sensed bits or soft bits (e.g., voltages AR−V1, AR+V2, AR−V3, AR+V4, in FIG. 3). To illustrate, the storage elements 113-117 may each be programmed to one of multiple predefined states. Each of the predefined states may be mapped to a particular bit value (e.g. a single bit value ("0" or "1") or a multi-bit value, such as "101"). The bit value that corresponds to the determined MLC state is referred to as "hard bit(s)". Additional information that can be used to indicate a reliability of the reading of the storage element is referred to as a "soft bit". A soft bit can be used by an error correction coding (ECC) engine 108 within a rank modulation decoder 116 in conjunction with one or more hard bits to enhance a reading operation by indicating a relative reliability of the hard bits read from the memory 104.

The controller 106 includes the ECC engine 108 and the rank modulation decoder 116. The ECC engine 108 may be configured to detect errors in the read data corresponding to the storage elements 112. An output of the rank modulation decoder 116 may be provided to the host device 130 while the data storage device 102 is operatively coupled to the host device 130.

To write data to the memory 104, the controller 106 may provide a rank modulation codeword 140 to the memory 104 via the bus 150. For example, the bus 150 may be a Secure Digital (SD) bus. The memory 104 is configured to store the representation of the rank modulation codeword 140 in the memory portion 110. The rank modulation codeword 140 may be based on a non-binary symbol, such as symbol indicating a ranking of cells in one or more groups of cells according to relative threshold voltages of the cells. A number of cells in each group may equal the size of the non-binary symbol. A ranking of cells in each group (i.e., a relative threshold voltage each cell is programmed to) indicates a value of the non-binary symbol. For example, a three-cell group may have six possible rankings and each possible ranking may correspond to a value of a non-binary symbol. For a group including cell 1, cell 2, and cell 3, having threshold voltages V1, V2, and V3, respectively, values of the non-binary symbol can correspond to rankings of the cells according to: V1>V2>V3=000, V1>V3>V2=001, V2>V1>V3=010, V2>V3>V1=011, V3>V1>V2=100, and V3>V2>V1=101, as an illustrative, non-limiting example.

The controller 106 may be configured to receive memory access requests from the host device 130 and to process data read from the memory 104. The controller 106 may be configured to receive hard bit values 152 and soft bit values 154 from the memory 104. For example, the hard bit values 152 and the soft bit values 154 may correspond to a representation of a rank modulation codeword read from the memory 104 and may include information about the representation of the rank modulation codeword 140 stored in the memory portion 110. To illustrate, each of the storage elements 113-117 may be programmed to a particular state to have relative values of the threshold voltages of the storage elements 113-117 set to a particular ranking order. For example, a threshold voltage within a defined range of values may indicate a particular state that is represented by a bit pattern. The hard bit values and the soft bit values of the bit patterns of each storage element of the group of storage elements 112 may correspond to the representation of the rank modulation codeword read from the MLC memory.

The host device 130 may be configured to provide data to be stored at the memory 104 or to request data to be read from the memory 104. For example, the host device 130 may include a mobile telephone, a music or video player, a gaming console, an electronic book reader, a personal digital assistant (PDA), a computer, such as a laptop computer, a notebook computer, or a tablet, any other electronic device, or any combination thereof.

During operation, the host device 130 may instruct the controller 106 to retrieve data corresponding to the group of storage elements 112, such as the storage elements 113-117, from the memory 104. The memory 104 may be configured to read the representation of the rank modulation codeword 140 from the group of storage elements 112 by comparing cell threshold voltages in the memory portion 110 to the hard bit thresholds 122 to generate the hard bit values 152 and to the soft bit thresholds 124 to generate the soft bit values 154. For example, each storage element 113-117 may have a threshold voltage corresponding to a state of the storage element. The state of each storage element 113-117 (i.e., a range of threshold voltage values) may be read by comparing the threshold voltage of each of the storage elements 113-117 to the hard bit thresholds 122 to generate the hard bit values 152 and a sub-range of threshold voltage values may be read by comparing the threshold voltage of each of the storage elements 113-117 to the soft bit thresholds 124 to generate the soft bit values 154. The controller 106 may provide the hard bit values 152 and the soft bit values 154 as an input to the rank modulation decoder 116.

The rank modulation decoder 116 may be configured to map the hard bit values 152 to an ECC codeword that is decodable by the ECC engine 108. For example, the ECC engine may be a Reed Solomon ECC engine, a Bose-Chaudhuri-Hocquenghem (BCH) ECC engine, a low-density parity-check ECC engine, one or more other ECC engines, or any combination thereof. The rank modulation decoder 116 may convert the hard bit values 152 to an ECC codeword that is input to the ECC engine 108.

The soft bit values 154 may provide reliability information about the states read from the storage elements 113-117 in the memory portion 110. The reliability information may include, for each storage element 113-117 that is read, a value that indicates a likelihood that the hard bit values for that storage element are correct. For example, the soft bit values 154 may be used by the rank modulation decoder 116 to obtain a reliability indicator for each bit of the ECC codeword provided to the ECC engine 108, such as a log-likelihood ratio (LLR). The rank modulation decoder 116 may be configured to use the reliability information to guide error correction processing at the ECC engine 108 to generate decoded data bits based on the received hard bit values 152 and the soft bit values 154. For example, the ECC engine 108 may perform probabilistic decoding by iteratively updating bit estimates and LLRs of the bit estimates based on bit estimates and LLRs of the bit estimates of a prior iteration of a decoding process to converge to a most probable ECC codeword. The soft bit values 154 enable the rank modulation decoder 116 to establish initial reliability values (e.g., LLRs) that are more accurate than default LLRs that may be used by conventional decoders that use hard bits only. Using more accurate initial reliability values (e.g. LLRs based on the soft bit values 154) enables the rank modulation decoder 116 to converge more quickly and/or more accurately. As a result, decoding of a representation of an ECC codeword may be performed with reduced latency, with improved error correction capability, or a combination thereof.

Rank modulation is a technique in which information may be stored as relative voltage levels of multiple cells of the memory rather than as absolute voltage levels in each cell. For example, in a single level cell (SLC) memory having four cells, four bits may be stored as absolute voltage levels in each cell of the cells. In a two-bits-per-cell (2-BPC) memory having four cells, 8 bits (e.g., 2×4) may be stored.

In contrast to storing data as absolute voltage levels, rank modulation using four cells to represent information may be described by denoting the four cells as 1, 2, 3, and 4, respectively. Each of the four cells 1-4 may have a corresponding threshold voltage denoted by $V_1$, $V_2$, $V_3$, and $V_4$, respectively. The four cells 1-4 may be ranked or represented in descending order of their respective voltage levels. For example, a 3-4-1-2 ranking of voltage levels may represent that $V_3 > V_4 > V_1 > V_2$.

Accordingly, there are 4! (i.e., 4 factorial)=24 combinations (i.e., rankings of voltage levels) for the four cells. By using four memory cells in a rank modulation scheme, $\log_2 24 = 4.585$ bits may be represented. This number is slightly higher than that of a conventional SLC memory using four cells but lower than a conventional 2-BPC memory having four cells.

Table 1 illustrates a number of bits that can be stored in an M-cell unit.

TABLE 1

| | Rank Modulation | 1-BPC | 2-BPC | 3-BPC |
|---|---|---|---|---|
| M cells | $\log_2(M!)$ | M | 2M | 3M |
| 2 cells | 1 | 2 | 4 | 6 |
| 3 cells | 2.585 | 3 | 6 | 9 |
| 4 cells | 4.585 | 4 | 8 | 12 |

If four cells are used together for rank modulation, when writing information to a memory, user data may be mapped to one of the twenty four combinations by some predefined mapping, such as a Gray mapping, and the voltage cell may be programmed according to the predefined voltage rank among the four cells. For example, if the chosen rank combination is 3-4-1-2, the voltage may be programmed such that $V_3 > V_4 > V_1 > V_2$. When the user data is read back, the relative voltages of the four cells may be sensed and a ranking may be determined. For example, if $U_1$, $U_2$, $U_3$, and $U_4$ denote the sensed voltages of the cells 1, 2, 3, and 4, respectively, and if it is determined that $U_3 > U_4 > U_1 > U_2$, then it may be determined that the 3-4-1-2 combination is correctly read among the twenty four possible combinations. If other ranks, such as 4-3-1-2 or 3-1-4-2 were read, a read error may be detected and handled using error correction coding. Either binary or non-binary error correction codes may be used.

Figure 2:
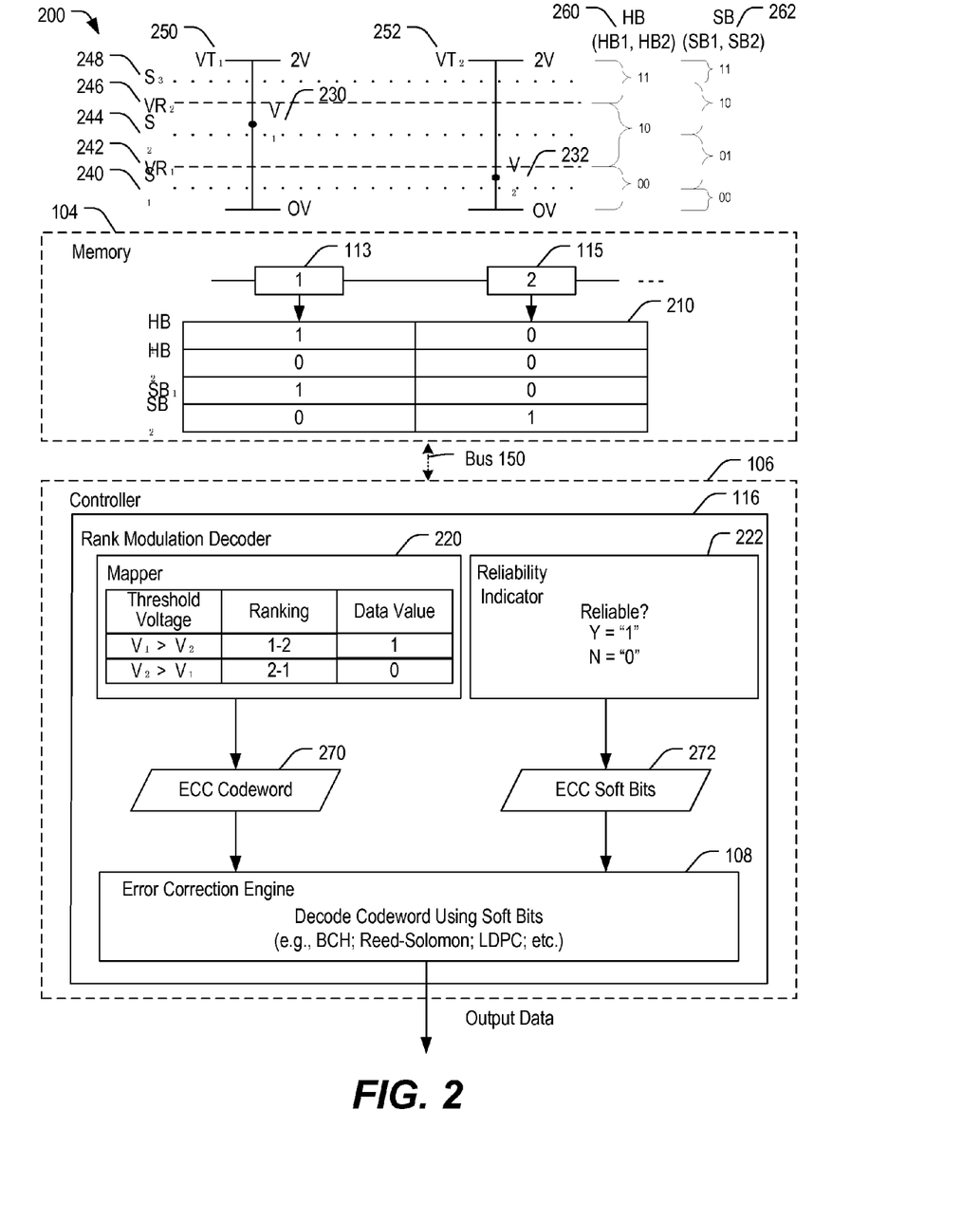
FIG. 2 is a diagram illustrating use of soft bits and hard bits in rank modulation decoding.

An illustrative example of using rank modulation in a two cell unit is shown in FIG. 2. FIG. 2 depicts a general diagram 200 illustrating a use of soft bits and hard bits in rank modulation decoding. The diagram 200 includes the memory 104 coupled to the controller 106 via the bus 150.

The memory 104 (shown with dashed lines) includes a table 210, the first representative storage element 113, and the second representative storage element 115. The table 210 may include hard bit data and soft bit data, such as hard bits 260 and soft bits 262, respectively, stored in latches or registers of the memory 104. The hard bit data and the soft bit data indicates a threshold voltage range for each storage element, enabling determination of a relative voltage level (i.e., a ranking) of the storage elements that indicates stored information at the first storage element 113 and at the second storage element 115.

To illustrate, each of the storage elements 113, 115 may have a corresponding threshold voltage. For example, the first storage element 113 may have a first threshold voltage $V_1$ 230 in a first voltage range $VT_1$ 250 and the second storage element 115 may have a second threshold voltage $V_2$ 232 in a second voltage range $VT_2$ 252. For example, the first voltage range $VT_1$ 250 may be from zero volts to two volts and the second voltage range $VT_2$ 252 may also be from zero volts to two volts.

The hard bits 260 may indicate results of comparing the threshold voltage of each particular cell (e.g., the first threshold voltage $V_1$ 230 and the second threshold voltage $V_2$ 232) to one or more hard bit thresholds. For example, data may be read from the first storage element 113 and from the second storage element 115 by comparing a threshold voltage of each storage elements to a first hard bit threshold or read voltage $VR_1$ 242 and to a second hard bit threshold or read voltage $VR_2$ 246. As illustrated, the first hard bit read voltage $VR_1$ 242 is less than the second hard bit read voltage $VR_2$ 246.

The hard bits 260 (i.e., $HB_1$, $HB_2$) having a value of "11" may correspond to a threshold voltage value greater than the second hard bit read voltage $VR_2$ 246. The hard bits 260 having a value of "10" may correspond to a threshold voltage value between the first hard bit read voltage $VR_1$ 242 and the second hard bit read voltage $VR_2$ 246. The hard bits 260 having a value of "00" may correspond to a threshold voltage value less than the first hard bit read voltage $VR_1$ 242.

As illustrated, the first threshold voltage $V_1$ 230 is greater than the first hard bit read voltage $VR_1$ 242 and less than the second hard bit read voltage $VR_2$ 246. The second threshold voltage $V_2$ 232 is less than the first hard bit read voltage $VR_1$ 242 and less than the second hard bit read voltage $VR_2$ 246. Accordingly, the hard bits 260 having a value of "10" (i.e., illustrated as $HB_1=1$ and $HB_2=0$ in the table 210) indicates that the first threshold voltage $V_1$ 230 is greater than the first hard bit read voltage $VR_1$ 242 and less than the second hard bit read voltage $VR_2$ 246. Similarly, the hard bits 260 having a value of "00" (i.e., illustrated as $HB_1=0$ and $HB_2=0$ in the table 210) indicates that the second threshold voltage $V_2$ 232 is less than the first hard bit read voltage $VR_1$ 242 and less than the second hard bit read voltage $VR_2$ 246.

The soft bits 262 may indicate results of comparing the threshold voltage of each particular cell (e.g., the first threshold voltage $V_1$ 230 and the second threshold voltage $V_2$ 232) to one or more soft bit thresholds. For example, the threshold voltage of the first storage element 113 and of the second storage element 115 may be compared to a first soft bit threshold or read voltage $S_1$ 240, a second soft bit threshold or read voltage $S_2$ 244, and a third soft bit threshold or read voltage $S_3$ 248. As illustrated, the first soft bit read voltage $S_1$ 240 may be less than the second soft bit read voltage $S_2$ 244, and the second soft bit read voltage $S_2$ 244 may be less than the third soft bit read voltage $S_3$ 248. In addition, the first hard bit read voltage $VR_1$ 242 may be less than the second soft bit read voltage $S_2$ 244 and greater than the first soft bit read voltage $S_1$ 240, and the second hard bit read voltage $VR_2$ 246 may be greater than the second soft bit read voltage $S_2$ 244 and less than the third soft bit read voltage $S_3$ 248. A first difference between the first soft bit read voltage $S_1$ 240 and the first hard bit read voltage $VR_1$ 242 may be substantially equal to a second difference between the first hard bit read voltage $VR_1$ 242 and the second soft bit read voltage $S_2$ 244.

The soft bits 262 (i.e., $SB_1$, $SB_2$) having a value of "11" may correspond to a threshold voltage value greater than the third soft bit read voltage $S_3$ 248. The soft bits 262 having a value of "10" may correspond to a threshold voltage value between the third soft bit read voltage $S_3$ 248 and the second soft bit read voltage $S_2$ 244. The soft bits 262 having a value of "01" may correspond to a threshold voltage value between the second soft bit read voltage $S_2$ 244 and the first soft bit read voltage $S_1$ 240. The soft bits 262 having a value of "00" may correspond to a threshold voltage value less than the first soft bit read voltage $S_1$ 240. Accordingly, the soft bits 262 for storage element 113 having a value of "10" indicates that the first threshold voltage $V_1$ 230 ha a value between the third soft bit read voltage $S_3$ 248 and the second soft bit read voltage $S_2$ 244. Similarly, the soft bits 262 for storage element 115 having a value of "01" indicates that the second threshold voltage $V_2$ 232 has a value between the second soft bit read voltage $S_2$ 244 and the first soft bit read voltage $S_1$ 240.

The controller 106 (shown with dashed lines) includes the rank modulation decoder 116 that includes a mapper 220, a reliability indicator 222, and the error correction engine 108. The controller 106 may be configured to provide data read from the memory 104 to the rank modulation decoder 116. The data may include hard bit data, such as the hard bits 260, and soft bit data, such as the soft bits 262. For example, the controller 106 may receive data from the table 210 and provide the $HB_1$, $HB_2$, $SB_1$, and $SB_2$ values for each cell to the rank modulation decoder 116.

The mapper 220 may be configured to logically partition the data into groups of bits. Each group of bits may correspond to a group of cells in the memory 104. For example, the first storage element 113 and the second storage element 115 may correspond to one group of bits. The mapper 220 may be further configured to rank cells of each particular group of cells according to cell threshold voltages. For example, the mapper 220 may compare the first threshold voltage $V_1$ 230 and the second threshold voltage $V_2$ 232 and generate a ranking based on the comparison. For example, if the first threshold voltage $V_1$ 230 is greater than the second threshold voltage $V_2$ 232, a ranking of "1-2" may be generated by the mapper 220. Similarly, if the second threshold voltage $V_2$ 232 is greater than the first threshold voltage $V_1$ 230, a ranking of "2-1" may be generated by the mapper 220.

The mapper 220 may be further configured to map each group of bits to a data value according to the cell ranking of the group of cells corresponding to the group of bits. For example, the mapper 220 may generate a single bit symbol or data value (e.g., a "1" or a "0") based on a comparison of the first threshold voltage $V_1$ 230 and the second threshold voltage $V_2$ 232. If the first threshold voltage $V_1$ 230 is greater than the second threshold voltage $V_2$ 232, a data value of "1" may be generated by the mapper 220. If the second threshold voltage $V_2$ 232 is greater than the first threshold voltage $V_1$ 230, a value of "0" may be generated by the mapper 220. As another example, more than two storage elements can correspond to the group of bits. For example and as explained above, four cells or storage elements may be used to represent the data. In that case, the mapper 220 may generate a multi-bit symbol or data value (e.g., a 5-bit data value of "11001", "01100, etc.) based on a comparison of the threshold voltages of each cell. The mapper 220 may send the data values based on cell ranking to the ECC engine 108 as an ECC codeword 270.

The reliability indicator 222 may be configured to indicate a relative reliability of bit values in the ECC codeword 270 generated by the mapper 220 and may send relative reliability values to the ECC engine 108 as ECC soft bits 272. The relative reliability may be based at least in part on a difference between the threshold voltages of the cells of each particular group as determined based on the soft bit thresholds $S_1$-$S_3$. For example, the relative reliability may increase as a difference between cell threshold voltages increases. To illustrate, if the difference between the first threshold voltage $V_1$ 230 and the second threshold voltage $V_2$ 232 is large, the relative reliability of the data value generated by the mapper 220 may be higher than if the difference between the first threshold voltage $V_1$ 230 and the second threshold voltage $V_2$ 232 is small. For example, a reliability indicator of "1" may indicate that the difference between the first threshold voltage $V_1$ 230 and the second threshold voltage $V_2$ 232 is large, and a reliability indicator of "0" may indicate that the difference between the first threshold voltage $V_1$ 230 and the second threshold voltage $V_2$ 232 is small.

The reliability indicator 222 may be configured to determine whether the first threshold voltage $V_1$ 230 and the second threshold voltage $V_2$ 232 are in adjacent sub-regions. For example, the first hard bit read voltage $VR_1$ 242 and the second hard bit read voltage $VR_1$ 246 may divide the first voltage range $VT_1$ 250 into three regions. The first soft bit read voltage $S_1$ 240, the second soft bit read voltage $S_2$ 244, and the third soft bit read voltage $S_3$ 248 may divide each region into two sub-regions. Based on the hard bits 260 and the soft bits 262, the reliability indicator 222 can determine which of the six sub-regions the first threshold voltage $V_1$ 230 is in and which of the six sub-regions the second threshold voltage $V_2$ 232 is in. When the first threshold voltage $V_1$ 230 and the second threshold voltage $V_2$ 232 are in adjacent sub-regions, a "0" may be output by the reliability indicator 222. When the first threshold voltage $V_1$ 230 and the second threshold voltage $V_2$ 232 are not in adjacent sub-regions, a "1" (or a larger number) may be output by the reliability indicator 222.

The controller 106 may be configured to initiate an ECC procedure on the ECC codeword 270 by providing the ECC codeword 270 and the ECC soft bits 272 to the ECC engine 108. For example, the ECC engine 108 may employ an ECC decoding scheme, such as a Reed Solomon ECC decoding scheme, a Bose-Chaudhuri-Hocquenghem (BCH) ECC decoding scheme, a low-density parity-check ECC decoding scheme, one or more other ECC decoding schemes, or any combination thereof. The ECC engine 108 may provide output data indicating that the ECC codeword 270 was correctly decoded.

During operation, the controller 106 may be instructed by the host device (not shown) to retrieve data corresponding to the storage elements 113, 115 from the memory 104. The controller 106 may provide data including hard bit data, such as hard bits 260 (i.e., $HB_1$, $HB_2$), and soft bit data, such as soft bits 262 (i.e., $SB_1$, $SB_2$), to the rank modulation decoder 116. The rank modulation decoder 116 may be configured to logically partition the data into groups of bits, where each group of bits may correspond to a group of cells in the memory 104. For example, the mapper 220 may compare the first threshold voltage $V_1$ 230 and the second threshold voltage $V_2$ 232 and generate a ranking based on the comparison. The rank modulation decoder 116 may be further configured to map each group of bits to a data value according to the cell ranking of the group of cells corresponding to the group of bits. For example, the mapper 220 may generate a data value based on a comparison of the first threshold voltage $V_1$ 230 and the second threshold voltage $V_2$ 232 and may send the data value based on cell ranking to the ECC engine 108 as the ECC codeword 270. A relative reliability of bit values in the ECC codeword 270 generated by the mapper 220 may be determined by the reliability indicator 222 and relative reliability values may be sent to the ECC engine 108 as the ECC soft bits 272. For example, if the difference between the first threshold voltage $V_1$ 230 and the second threshold voltage $V_2$ 232 is large, the relative reliability of the data value generated by the mapper 220 may be higher than if the difference between the first threshold voltage $V_1$ 230 and the second threshold voltage $V_2$ 232 is small. The controller 106 may be configured to initiate an ECC procedure on the ECC codeword 270 by providing the ECC codeword 270 and the ECC soft bits 272 to the ECC engine 108. The ECC engine 108 may provide output data indicating that the ECC codeword 270 was correctly decoded.

As illustrated by being shown with dashed lines, one or more components of FIG. 2 may be moved from a location as shown to a different location. For example, the mapper 220, the reliability indicator 222, or both, may be within the memory 104.

Figure 3:
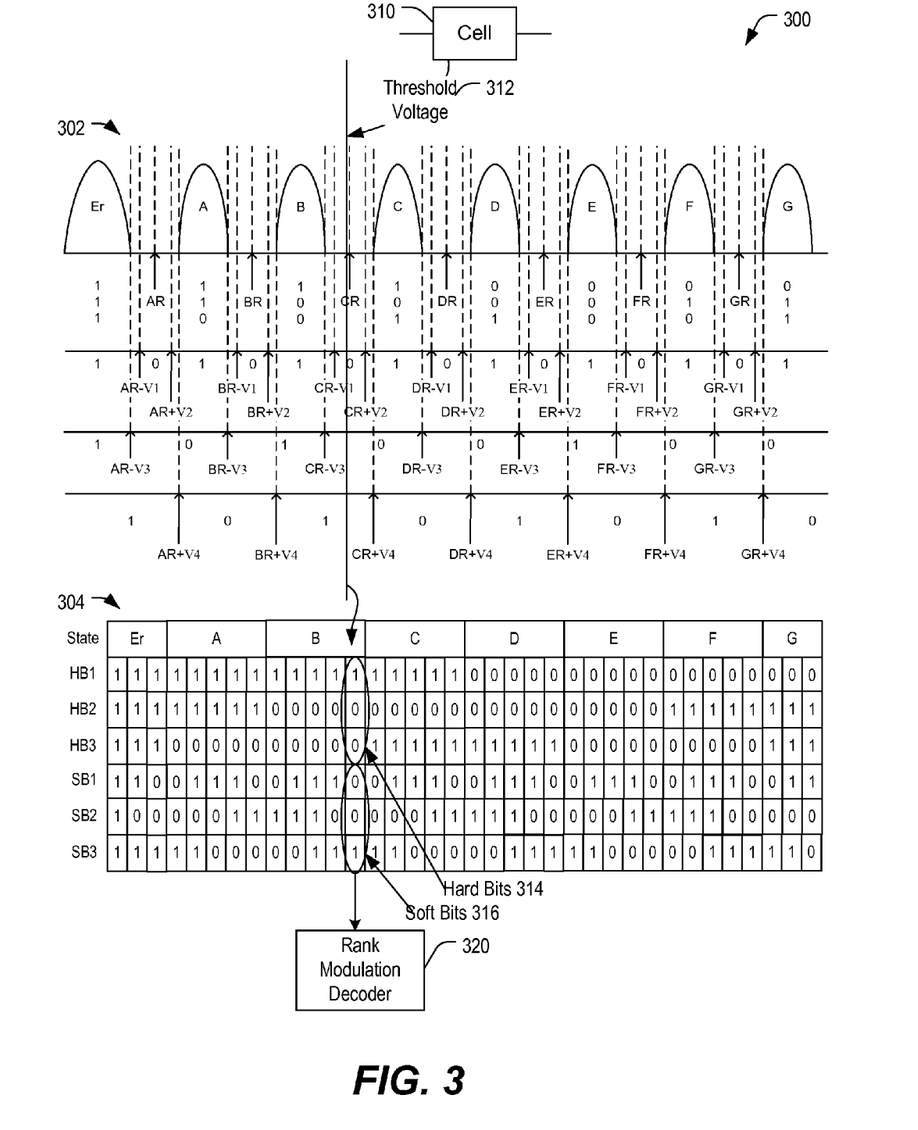
FIG. 3 is a general diagram illustrating a particular embodiment of a sensing scheme and includes a graphical depiction of cell state distributions and threshold read voltages for hard bits and additional sensed (soft) bits provided to a rank modulation decoder.

FIG. 3 shows an embodiment 300 of a sensing scheme and includes a graphical depiction 302 of cell distributions for voltage regions (i.e. states) (Er, A, . . . G) of a storage element of a memory, such as a representative memory cell 310, and threshold read voltages for hard bits (e.g., voltages AR, BR, . . . GR) and for additional sensed soft bits (e.g., voltages AR−V1, AR+V2, AR−V3, AR+V4, . . . ). A table 304 illustrates a mapping of each voltage interval between adjacent threshold read voltages to a set of six bits including three hard bits (HB1, HB2, HB3) and three soft bits (SB1, SB2, SB3). A pattern of hard bits and soft bits at the memory cell 310 may have a threshold voltage 312 corresponding to a state of the memory cell 310. A pattern of hard bits and soft bits at the memory cell 310 may be generated by comparing the threshold voltage 312 to the threshold read voltages for hard bits (e.g., voltages AR, BR, . . . GR) to generate hard bits 314 and to the threshold read voltages for soft bits (e.g., voltages AR−V1, AR+V2, AR−V3, AR+V4, . . . ) to generate soft bits 316.

The hard bits 314 indicate which state (Er-G) the threshold voltage 312 is in, and the soft bits 316 indicate whether the threshold voltage 312 is within a center of the state's voltage range or near an edge of the state's voltage range (e.g., indicates a proximity to voltage CR). As an example, a first voltage difference (V1) between a first soft bit threshold (e.g., CR−V1) and a particular hard bit threshold (e.g., CR) is substantially equal to a second voltage difference (V2) between the particular hard bit threshold (e.g., CR) and a second soft bit threshold (e.g., CR+V2). Further, as illustrated in FIG. 3, a third voltage difference (V3) between a third soft bit threshold and the particular hard bit threshold (CR) is substantially equal to a fourth voltage difference (V4) between the particular hard bit threshold (CR) and a fourth soft bit threshold. As illustrated, the first voltage difference (V1) is different than the third voltage difference (V3). As illustrated, the threshold voltage 312 is between BR and CR, indicating that the cell 310 is in state "B", corresponding to hard bits "100". The threshold voltage 312 is also in a sub-region between CR−V1 and CR, corresponding to a soft bit value of "001".

The controller 106 may provide the hard bits 314 and the soft bits 316 to an input of a rank modulation decoder 320 to obtain decoded data. The soft bits 316 may include reliability information about the hard bits read from the memory cell 310. The rank modulation decoder 320 may be configured to use the soft bits 316 indicating a sub-region of the cell's state (i.e., the sub-region of the state "B" closest to the voltage CR) to guide error correction processing based on the received soft bits, such as by generating ECC soft bits to be input to an ECC decoder, such as the ECC soft bits 272 of FIG. 2.

Figure 4:
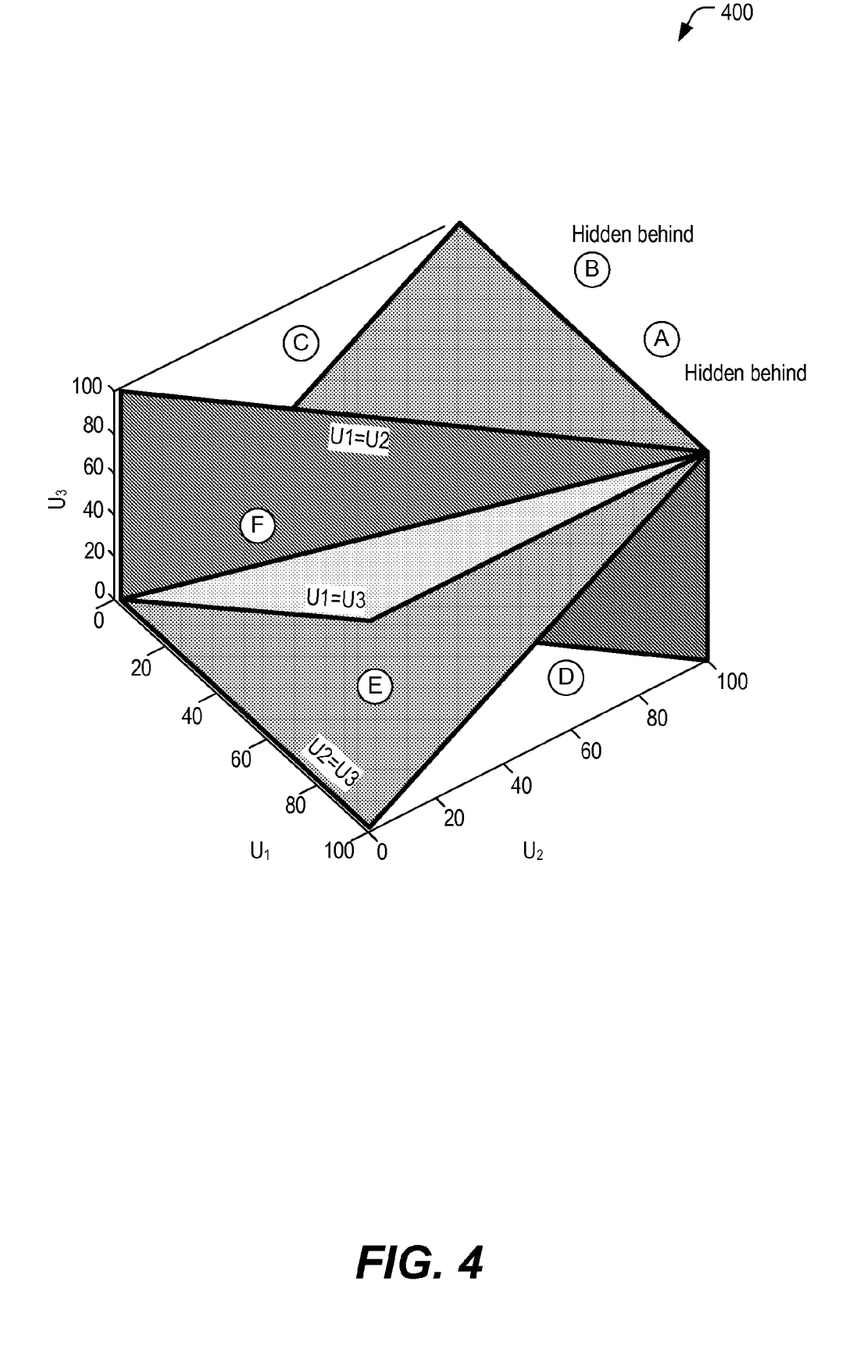
FIG. 4 is a general diagram graphically illustrating states of a three-cell rank modulation group.

Referring to FIG. 4, a general diagram graphically illustrating states of a three-cell rank modulation group is depicted and generally designated 400. The diagram 400 illustrates three axes labeled as U1, U2, and U3 that define a space (U1, U2, U3). Planes U1=U2, U2=U3, and U3=U1 are illustrated that partition the space (U1, U2, U3) into 3!=6 regions. Four of the six regions (i.e., regions C, D, E, and F) are shown and two of the six regions (i.e., regions A and B) are hidden by the planes. For example, the states of the three-cell rank modulation group may correspond to states of a three-cell group including cell 1, cell 2, and cell 3 (e.g. the storage elements 113, 115, and 117 of FIG. 1, respectively) where U1 is a threshold voltage of cell 1 (e.g. the storage element 113), U2 is a threshold voltage of cell 2 (e.g. the storage element 115), and U3 is a threshold voltage of cell 3 (e.g. the storage element 117). Each region A-F corresponds to a different data value stored in the three-cell rank modulation group. To illustrate, region E corresponds to the state U1>U3>U2.

Figure 5:
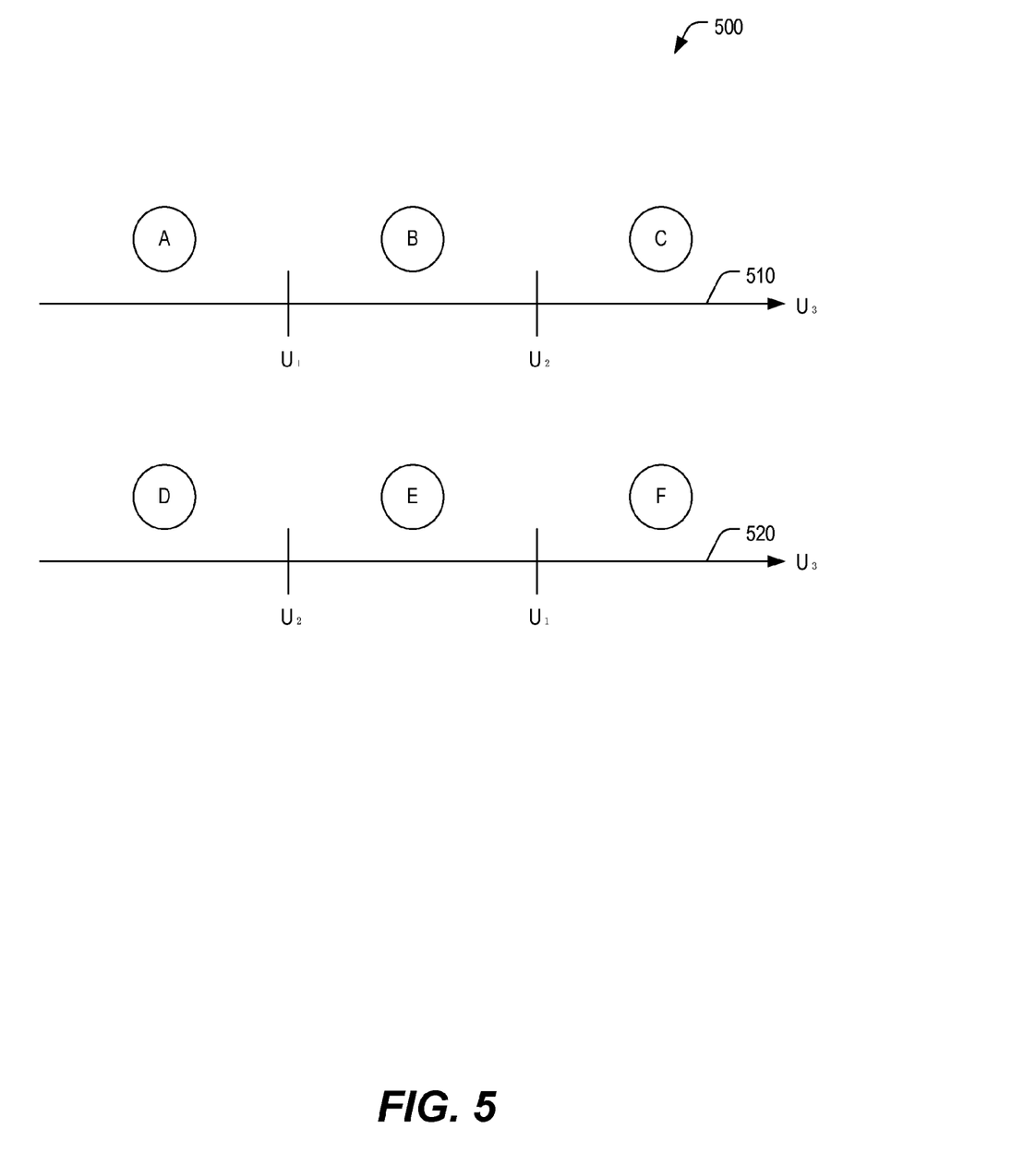
FIG. 5 is a general diagram illustrating an example of hard bit thresholds in a three-cell group using rank modulation decoding.

Referring to FIG. 5, a general diagram 500 illustrates an example of hard bit thresholds of the three-cell rank modulation group of FIG. 4. The diagram 500 illustrates intersections between the line $U_3$ of FIG. 4 and each of two surfaces: $U_3=U_1$ at $U_1=u_1$ and $U_3=U_2$ at $U_2=u_2$, where $u_1$ and $u_2$ correspond to voltage measurements of one of the three cells (i.e., cell 1) and another one of the three cells (i.e., cell 2), respectively. An upper portion or top line 510 corresponds to a region where $u_1<u_2$, and a lower portion or bottom line 520 corresponds to a region where $u_1>u_2$. The voltage measurements $u_1$ and $u_2$ may correspond to voltage thresholds that may be used to determine hard bit values.

For example, a threshold voltage ($u_1$) of cell 1 and a threshold voltage ($u_2$) of cell 2 may be measured (or otherwise determined). The threshold voltages $u_1$ and $u_2$ may be used as hard bit thresholds to compare to a threshold voltage ($u_3$) of cell 3. If $u_1<u_2$ and the threshold voltage of cell 3 is less than $u_1$, then a hard bit may indicate that a measure point (e.g., a threshold voltage of cell 3) is within region A. If $u_1<u_2$ and the threshold voltage of cell 3 is between $u_1$ and $u_2$, then a hard bit may indicate that the measure point is within region B. If $u_1>u_2$ and the threshold voltage of cell 3 is greater than $u_2$, then a hard bit may indicate that the measure point is within region C. Similarly, If $u_2<u_1$ and the threshold voltage of cell 3 is less than $u_2$, then a hard bit may indicate that the measure point is within region D. If $u_2<u_1$ and the threshold voltage of cell 3 is between $u_1$ and $u_2$, then a hard bit may indicate that the measure point is within region E. If $u_2<u_1$ and the threshold voltage of cell 3 is greater than $u_1$, then a hard bit may indicate that the measure point is within region F. As illustrated, a hard bit that corresponds to a hard bit threshold may only provide information as to which particular region among the six regions the measure point belongs to.

Figure 6:
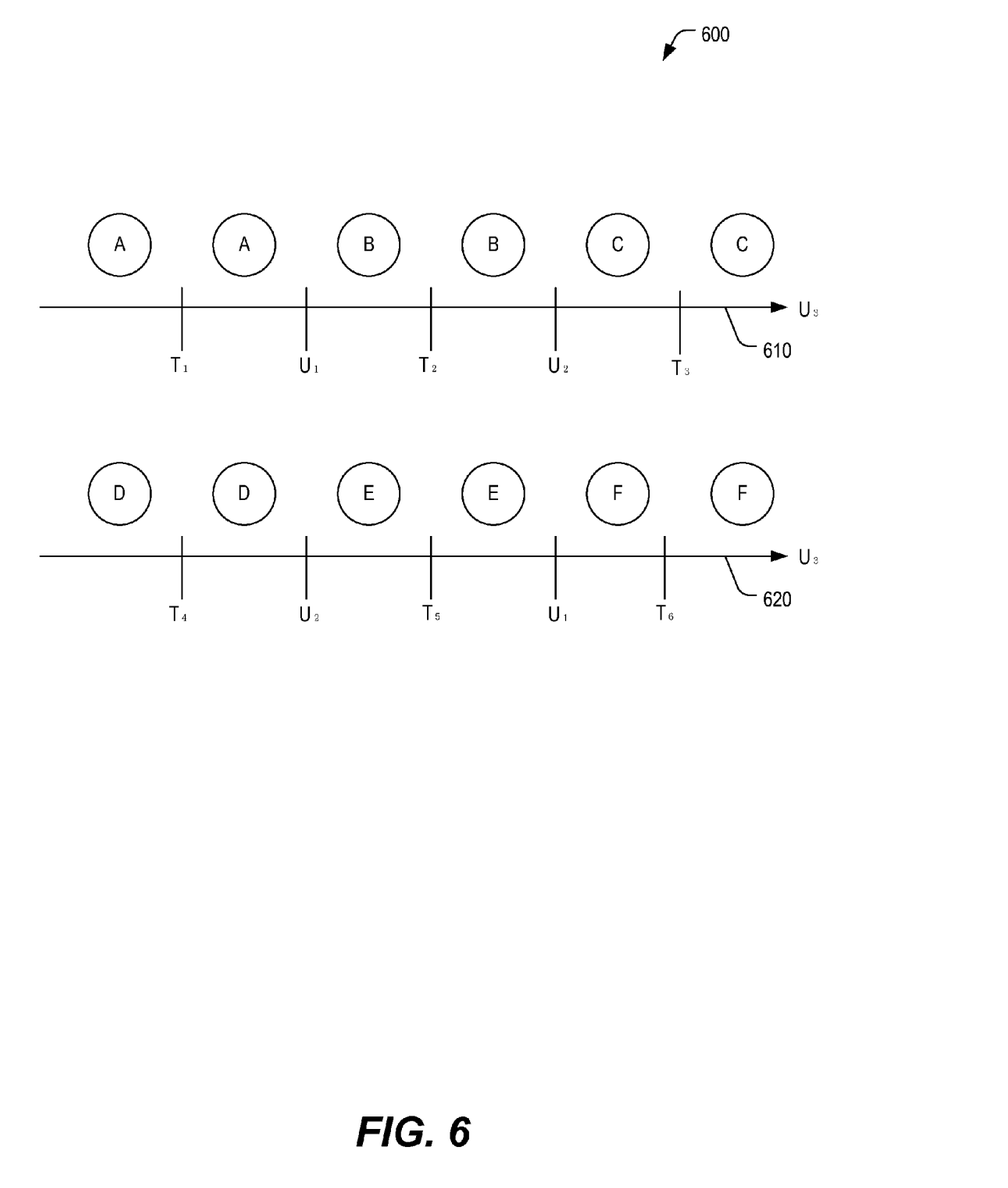
FIG. 6 is a general diagram illustrating an example of soft bit thresholds in a three-cell group using rank modulation decoding.

Referring to FIG. 6, a general diagram illustrating an example of soft bit thresholds in a three-cell group in rank modulation decoding is depicted and generally designated 600. The diagram 600 illustrates dividing each hard bit region of FIG. 5 (i.e., hard bit regions A, B, C, D, E, and F) into smaller sub-regions (i.e., sub-regions $A_1$, $A_2$, $B_1$, $B_2$, $C_1$, $C_2$, $D_1$, $D_2$, $E_1$, $E_2$, $F_1$, $F_2$). For example, soft bit thresholds (denoted by $T_1, T_2, \ldots T_6$) may be added between the values of $u_1$ and $u_2$ to divide each hard bit region into smaller regions. As illustrated in FIG. 5, six regions or possible results from voltage sensing may be achieved using only hard bits, and three bits may be used to represent this result. If soft bits and hard bits are used as shown in FIG. 6, twelve possible results from voltage sensing may be achieved, and four bits may be used to represent this result.

Figure 7:
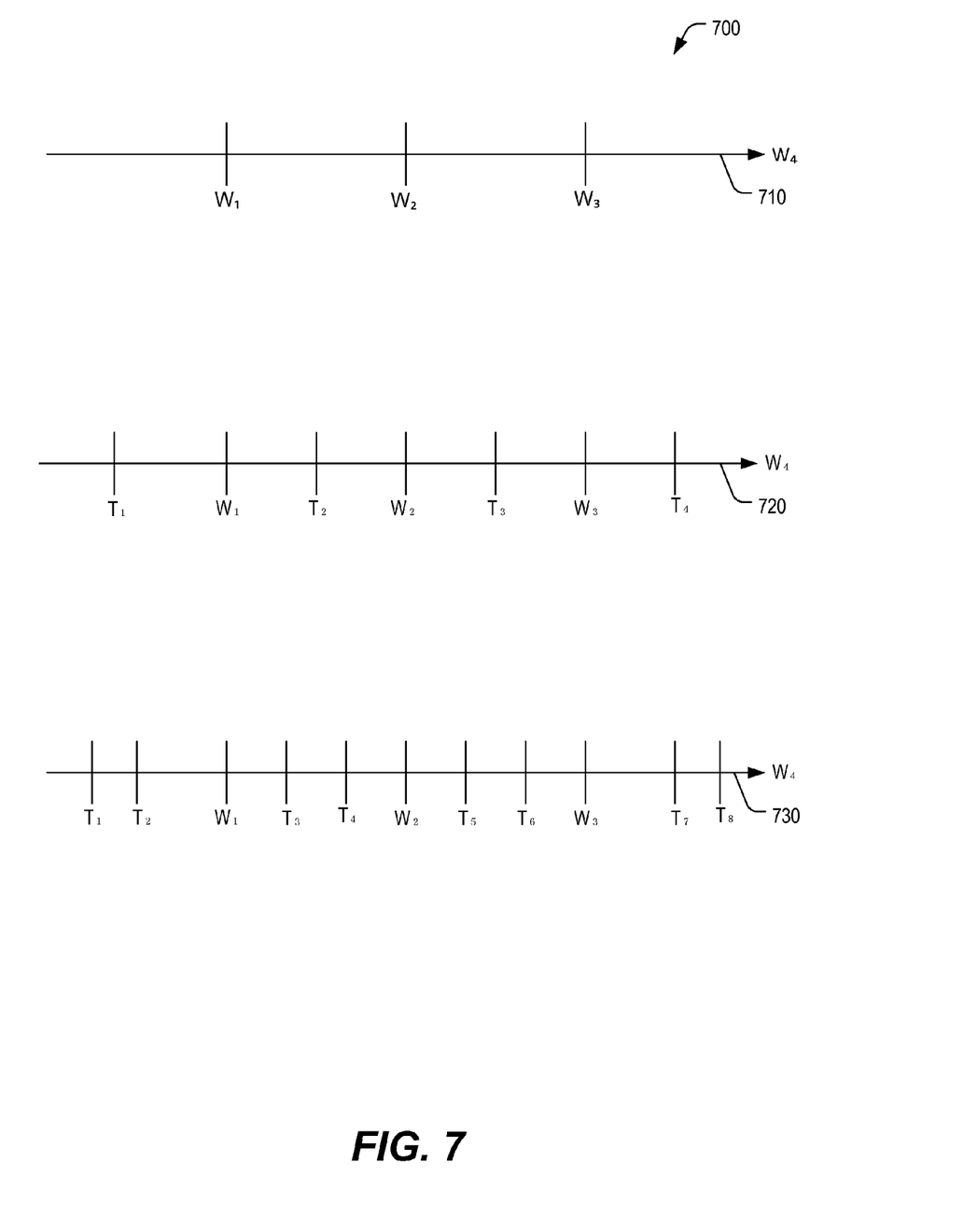
FIG. 7 is a general diagram illustrating an example of soft bit thresholds in a four cell group using rank modulation decoding.

Referring to FIG. 7, a general diagram illustrating an example of soft bit thresholds in a four cell group in rank modulation decoding is depicted and generally designated 700. A top line 710 illustrates using hard bits only, a middle line 720 illustrates the addition of one soft bit threshold per hard bit region, and a bottom line 730 illustrates the addition of two soft bit thresholds per hard bit region. The variables $w_1$, $w_2$, $w_3$, and $w_4$ may correspond to voltage measurements $u_1$, $u_2$, $u_3$, and $u_4$ in ascending order of voltage. Accordingly; there are 3!=6 possible combinations (i.e., for $w_1$, $w_2$, and $w_3$) for comparison to $w_4$. As illustrated, there are four regions shown in the top line 710 (i.e., using hard bits only), where each of the four regions has six possible combinations, for a total of twenty four possible combinations. Accordingly, five bits may be used to represent the twenty four combinations. There are eight regions shown in the middle line 720 (i.e., adding one soft bit threshold per hard bit region of line 710), where each of the eight regions has six possible combinations, for a total of forty eight possible combinations. Accordingly, six bits may be used to represent the forty eight combinations. There are twelve regions shown in the bottom line 730 (i.e., adding two soft bit thresholds per hard bit region of line 710), where each of the twelve regions has six possible combinations, for a total of seventy two possible combinations. Accordingly, seven bits may be used to represent the seventy two combinations. Similarly, another number of soft bit thresholds per hard bit region, such as three soft bit thresholds or more, may also be added per hard bit region. Alternatively, the number of soft bit thresholds per hard bit region may not be uniform. For example, the number of soft bit thresholds may differ between a hard bit region defined by $w_1$ and $w_2$ and a hard bit region defined by $w_2$ and $w_3$.

Each line shown in FIG. 5 (i.e., line 510, line 520), FIG. 6 (i.e., line 610, line 620), and FIG. 7 (i.e., line 710, line 720, line 730) may be referred to as a projection line. For M-cell rank modulation, if L soft bit thresholds are added per projection line, a number of bits that can represent a voltage sensing result may be represented as $\log_2(M-1)!(M+L)$ (rounded up to a nearest integer value), where $(M-1)!$ is the number of cases (projection lines). For example, for M=3 as illustrated in FIG. 6, the number of projection lines is $(3-1)!=2$ (i.e. a line for the case U1>U2 and a line for the case U1<U2), and for M=4 as illustrated in FIG. 7, the number of cases is $(4-1)!=6$ (i.e. a line for each of the cases W1>W2>W3, W1>W3>W2, W2>W1>W3, W2>W3>W1, W3>W1>W2, and W3>W2>W1). (M+L) is the number of regions per projection line.

For example, when writing data to a memory when M=2, a first cell (cell 1) may be programmed at a voltage V1 and a second cell (cell 2) may be programmed at a voltage V2 to store a hard bit X such that V1>V2 if X=0, and V1<V2 if X=1. When reading the data, a voltage U1 may be sensed in cell 1 and a voltage U2 may be sensed in cell 2. A hard bit Y (an estimate of X) may be read such that Y=0 if U1>U2, and Y=1 if U1<U2.

An uncertainty due to physical effects may be modeled such that U1=V1+N1, and U2=V2+N2, where N1 and N2 are random variables that describe the uncertainty. Any arbitrary random variables may be used, including zero-mean Gaussian random variables.

For example, a transition probability matrix can be illustrated for a hard bit only case as follows:

$$Q_{hard} = \begin{pmatrix} P(U1 > U2 \mid V1 > V2) & P(U1 > U2 \mid V1 < V2) \\ P(U1 < U2 \mid V1 > V2) & P(U1 < U2 \mid V1 < V2) \end{pmatrix}.$$

where P(A|B) indicates the probability of A given B. For example, P(U1>U2|V1>V2) indicates the probability that cell 1 is read as having a greater threshold voltage than cell 2 given that cell 1 is programmed to have a greater threshold than cell 2. If programming occurs such that |V1−V2|=d, then the transition probability matrix in terms of the uncertainty or noise variables and the voltage spacing d may be illustrated as $$Q_{hard} = \begin{pmatrix} P(N1 - N2 > -d \mid X = 0) & P(N1 - N2 > d \mid X = 1) \\ P(N1 - N2 < -d \mid X = 0) & P(N1 - N2 < d \mid X = 1) \end{pmatrix}.$$

N may be defined as N=N1−N2 to simplify the notation $$Q_{hard} = \begin{pmatrix} P(N > -d \mid X = 0) & P(N > d \mid X = 1) \\ P(N < -d \mid X = 0) & P(N < d \mid X = 1) \end{pmatrix}.$$

Note that an expectation of N (E(N))=E(N1)−E(N2) and a variance of N (Var(N))=Var(N1)+Var(N2).

If the M cells have identical noise variances, the overall noise variance is M times each cell's noise variance. That is, the M-cell noise sigma (i.e., standard deviation) will be $\sqrt{M}$ times the noise sigma of one cell. The transition probability matrix for hard bits may be used to compare a cell information capacity using hard bits only to rank modulation cell information capacity using hard bits and soft bits, as explained with respect to FIG. 8.

Figure 8:
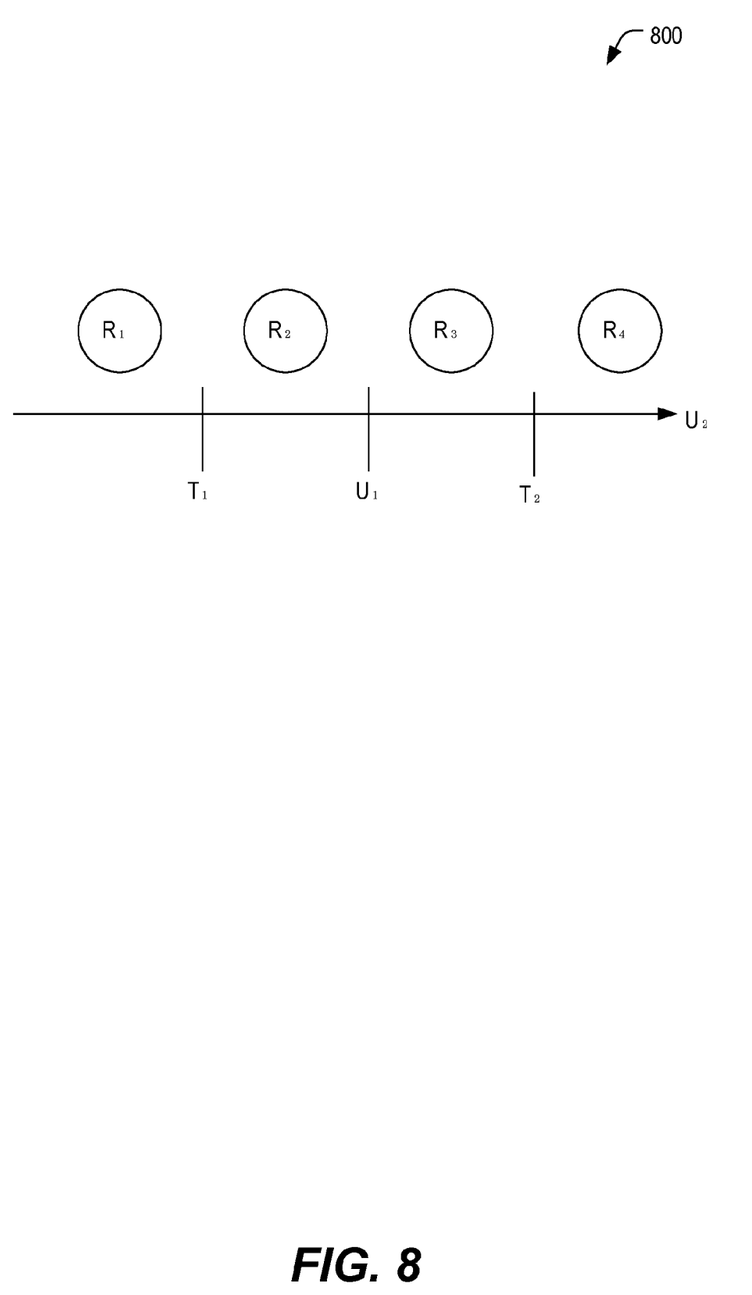
FIG. 8 is a general diagram illustrating an example of one soft bit threshold per hard bit region in a two cell group using rank modulation decoding.

Referring to FIG. 8, a general diagram illustrating an example of one soft bit threshold per hard bit region in a two cell (i.e., M=2) group is depicted and generally designated 800. A first soft bit threshold T1 and a second soft bit threshold T2 are illustrated defining sub-regions $R_1$, $R_2$, $R_3$, and $R_4$.

Using FIG. 8, a transition probability matrix may be determined $$Q_{soft1} = \begin{pmatrix} P(R1 \mid V1 > V2) & P(R1 \mid V1 < V2) \\ P(R2 \mid V1 > V2) & P(R2 \mid V1 < V2) \\ P(R3 \mid V1 > V2) & P(R3 \mid V1 < V2) \\ P(R4 \mid V1 > V2) & P(R4 \mid V1 < V2) \end{pmatrix}$$

If h1 and h2 are defined such that U1−T1=h1 and T2−U1=h2, then $$Q_{soft1} = \begin{pmatrix} P(U2 < U1 - h1 \mid V1 > V2) & P(U2 < U1 - h1 \mid V1 < V2) \\ P(U1 - h1 < U2 < U1 \mid V1 > V2) & P(U1 - h1 < U2 < U1 \mid V1 < V2) \\ P(U1 < U2 < U1 + h2 \mid V1 > V2) & P(U1 < U2 < U1 + h2 \mid V1 < V2) \\ P(U1 + h2 < U2 \mid V1 > V2) & P(U1 + h2 < U2 \mid V1 < V2) \end{pmatrix}$$

In terms of noise variables:

$$Q_{soft1} = \begin{pmatrix} P(N > -d + h1 \mid X = 0) & P(N > d + h1 \mid X = 1) \\ P(-d + h1 > N > -d \mid X = 0) & P(d + h1 > N > d \mid X = 1) \\ P(-d > N > -d - h2 \mid X = 0) & P(d > N > d - h2 \mid X = 1) \\ P(N < -d - h2 \mid X = 0) & P(N < d - h2 \mid X = 1) \end{pmatrix}$$

Each memory cell, such as the memory cell 310 of FIG. 3, has a theoretical storage capacity to store an amount of information, referred to as an information capacity (C). The information capacity (C) is a function of probabilities that particular data values are stored to a cell and probabilities of errors occurring to the stored data values due to noise or other effects in the cell. A theoretical lower bound of a cell's information capacity occurs when all data values are equally probable to be stored in the cell (known as "information capacity with scrambler assumption"—data is assumed to be scrambled prior to storage and therefore all data values are equally probable). An information capacity (C) in bits/cell and a lower bound information capacity with scrambler assumption ($C_{scramble}$) may be calculated as follows:

$$C = \max_{p(X)} \sum_{X,R} p(R \mid X) p(X) \log_2 \frac{p(R \mid X)}{\sum_X p(R \mid X) p(X)},$$

$$C_{scramble} = \frac{1}{|X|} \sum_{X,Y} p(R \mid X) \log_2 \frac{p(R \mid X) |X|}{\sum_X p(R \mid X)},$$

where X is the original hard bits that were written in a writing operation, R is a voltage region that is sensed during a read operation, and is the number of possible hard bits.

For example, in 3-cell rank modulation with hard bits only, X may be one of the 3!=6 combinations (|X|=6) and R may be one of the 6 voltage regions. A conditional probability mass function (PMF) p(R|X) may be given as the transition probability matrix $Q_{soft1}$ as illustrated above.

Table 2 (below) illustrates, for several values of cell error rate (CER) and voltage spacing (d) between program states of cells in a rank modulation scheme, examples of soft bit threshold shift (h) values, cell information capacity values, and cell lifetime capacity values. Table 2 provides examples for cells that can be programmed to a threshold voltage in a 2 volt (V) range from −1V to 1V and having a 0.002% CER, a 0.2% CER, and a 1% CER in a conventional SLC scheme not using rank modulation (the CER corresponding to a noise standard deviation (sigma) of 0.2435, 0.3474, and 0.4299, respectively). For M=2, it may be assumed that the noise component in each cell is independent and identically distributed zero-mean Gaussian random variables with variance $\sigma^2$. Accordingly, E(N)=0 and Var(N)=$2\sigma^2$. A symmetric scheme h1=h2 may be used.

For each CER, examples are given for d=2V (i.e. the cells are programmed to −1V or to 1V), d=1V (i.e. the cells are programmed to −1V, 0V, or 1V), d=⅔V (i.e. the cells are programmed to −1V, −⅓V, ⅓V, or 1V), and d=0.5V (i.e. the cells are programmed to −1V, −½V, 0V, ½V, or 1V). For each value of d, an "optimal" soft-bit threshold shift (e.g. h1=h2) is provided as a value calculated to provide a theoretical maximum information capacity per cell. Information capacity is provided for the cells using hard bits only and using one soft bit for comparison purposes.

In addition, Table 2 provides examples of a lifetime information capacity of cells as the information capacity multiplied by (2/d), where 2/d indicates a number of data values that may be sequentially written to a group of cells without erasing the cells. For example, when d=2, each cell is programmed to −1V or to 1V, and a group of cells is erased each time a new data value is written to the group (i.e. changing a ranking from "1-2" to "2-1" or from "2-1" to "1-2"). In contrast, when d=½, the group of cells may be written four times without erasing. To illustrate:

Write #1: Program cell 1 to −1V, cell 2 to −½V; rank="0-1"; data=0

Write #2: Program cell 1 to 0V, cell 2 to −½V; rank="1-0"; data=1

Write #3: Program cell 1 to 0V, cell 2 to ½V; rank="0-1"; data=0

Write #4: Program cell 1 to 1V, cell 2 to ½V; rank="1-0"; data=1

Because using d=½ may result in four times fewer cell erasures than using d=2, a cell lifetime that may otherwise be limited by a number of erase cycles may be extended by a factor of four by using d=½ as compared to d=2.

TABLE 2

| CER (%) w/o Rank Mod, SLC +/− 1 V | Noise sigma for single cell | voltage spacing: d = \|V1 − V2\| | optimal soft-bit threshold shift: h | capacity | | Lifetime capacity: capacity * (2/d) | |
|---|---|---|---|---|---|---|---|
| | | | | Hard bit only | 1 Soft bit | Hard bit only | 1 Soft bit |
| 0.002% | 0.2435 | 2 | 0.2856 | 0.9997 | 0.9999 | 0.9997 | 0.9999 |
| 0.002% | 0.2435 | 1 | 0.3622 | 0.8586 | 0.9099 | 1.7171 | 1.8198 |
| 0.002% | 0.2435 | 2/3 | 0.3928 | 0.5788 | 0.6709 | 1.7365 | 2.0127 |
| 0.002% | 0.2435 | 0.5 | 0.4234 | 0.3846 | 0.4723 | 1.5383 | 1.8893 |
| 0.2% | 0.3474 | 2 | 0.4541 | 0.9792 | 0.9897 | 0.9792 | 0.9897 |
| 0.2% | 0.3474 | 1 | 0.5459 | 0.6155 | 0.7055 | 1.2309 | 1.4110 |
| 0.2% | 0.3474 | 2/3 | 0.6072 | 0.3453 | 0.4291 | 1.0360 | 1.2874 |
| 0.2% | 0.3474 | 0.5 | 0.6378 | 0.2118 | 0.2741 | 0.8474 | 1.0965 |
| 1% | 0.4299 | 2 | 0.6072 | 0.9192 | 0.9527 | 0.9192 | 0.9527 |
| 1% | 0.4299 | 1 | 0.7144 | 0.4638 | 0.5564 | 0.9277 | 1.1128 |
| 1% | 0.4299 | 2/3 | 0.7603 | 0.2416 | 0.3098 | 0.7248 | 0.9293 |
| 1% | 0.4299 | 0.5 | 0.7909 | 0.1440 | 0.1903 | 0.5759 | 0.7612 |

As illustrated in Table 2, information capacity is improved using one soft bit as compared to using hard bits only. In addition, although cell information capacity is reduced as d is increased, cell lifetime information capacity may instead increase as d is increased. A similar analysis for rank modulation of M>2 cells may also be performed.

Figure 9:
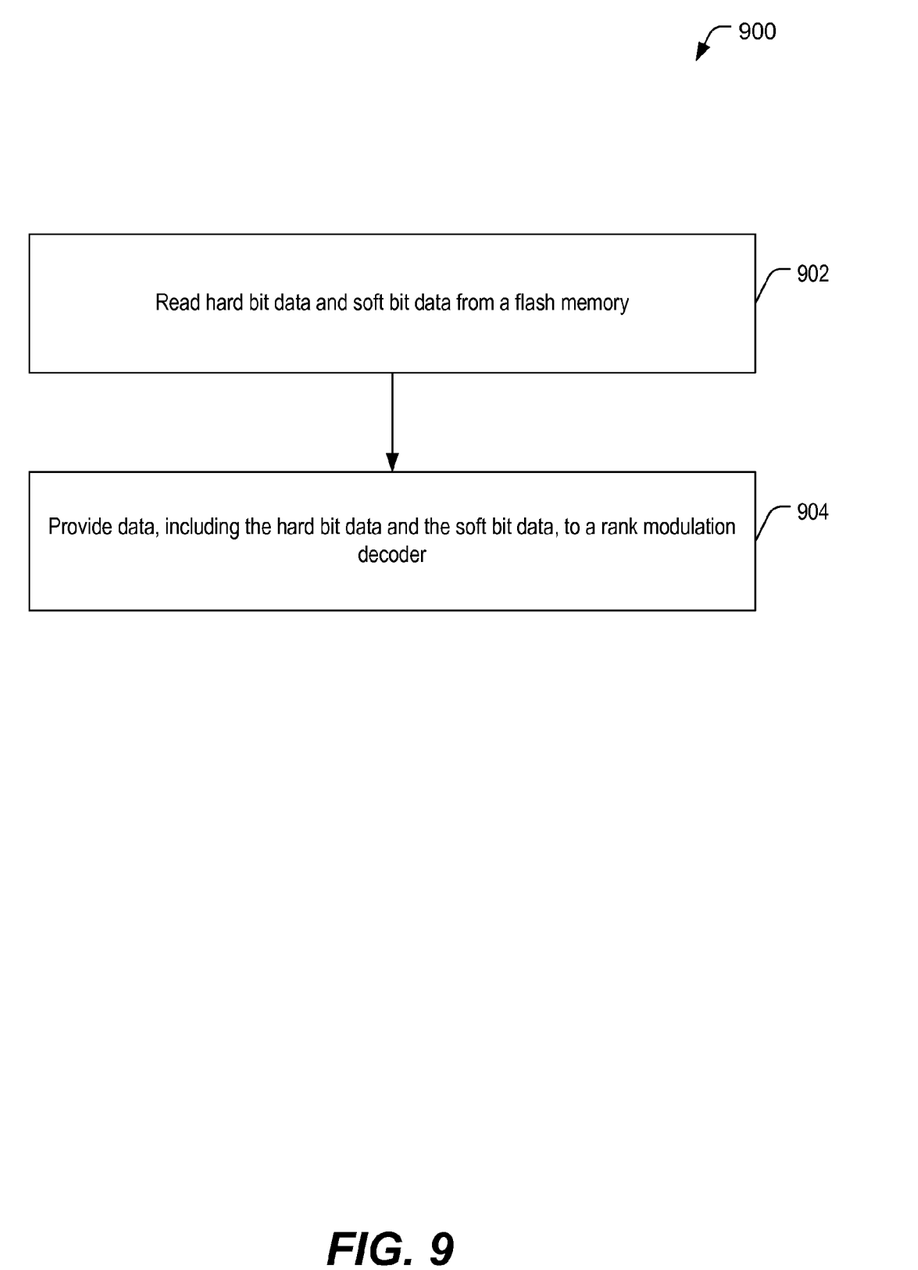
FIG. 9 is a flow diagram illustrating a particular embodiment of a method of providing data including hard bit data and soft bit data to a rank modulation decoder.

FIG. 9 depicts a flowchart that illustrates an embodiment of a method of providing data including hard bit data and soft bit data to a rank modulation decoder. The method 900 may be performed in a data storage device having a flash multi-level cell (MLC) memory. For example, the method 900 may be performed in the data storage device 102 of FIG. 1.

Hard bit data and soft bit data may be read from a flash memory, at 902. For example, the memory 104 may be configured to read the representation of the rank modulation codeword 140 from the group of storage elements 112 by comparing cell threshold voltages in the memory portion 110 to the hard bit thresholds 122 to generate the hard bit values 152 and to the soft bit thresholds 124 to generate the soft bit values 154.

Data, including hard bit data (e.g. the hard bit values 152 of FIG. 1) and soft bit data (e.g. the soft bit values 154 of FIG. 1), may be provided to a rank modulation decoder, at 904. For example, the memory 104 may include read circuitry configured to compare cell threshold voltages to one or more hard bit thresholds to generate the hard bit values 152 and to one or more soft bit thresholds to generate the soft bit values 154, latches configured to latch results of the comparisons, and a bus interface configured to provide the hard bit values 152 and the soft bit values 154 to the rank modulation decoder 116.

To illustrate, the data may be read from multiple cells of a memory, such as the storage elements 113-117 of the memory 104, where each particular cell of the multiple cells has a threshold voltage, and where the hard bit data includes hard bits that indicate results of comparing the threshold voltage of each particular cell to one or more hard bit thresholds and where the soft bit data includes soft bits that indicate results of comparing the threshold voltage of each particular cell to one or more soft bit thresholds.

For example, the first storage element 113 may have the first threshold voltage $V_1$ 230 in the first voltage range $VT_1$ 250 and the second storage element 115 may have the second threshold voltage $V_2$ 232 in the second voltage range $VT_2$ 252. Data may be read from the first storage element 113 and from the second storage element 115 based on comparisons of threshold voltages of the first storage element 113 and the second storage element 115 to the first hard bit threshold $VR_1$ 242 and to the second hard bit threshold $VR_2$ 246 to generate the hard bits 260. The hard bits 260 may indicate results of the comparisons of the threshold voltage of each particular cell (e.g., the first threshold voltage $V_1$ 230 and the second threshold voltage $V_2$ 232) and may indicate whether the first threshold voltage $V_1$ 230 is greater than or less than the second threshold voltage $V_2$ 232. For example, the hard bits 260 (i.e., $HB_1$, $HB_2$) having a value of "11" may correspond to a threshold voltage value greater than the second hard bit read voltage $VR_2$ 246. The hard bits 260 having a value of "10" may correspond to a threshold voltage value between the first hard bit read voltage $VR_1$ 242 and the second hard bit read voltage $VR_2$ 246. The hard bits 260 having a value of "00" may correspond to a threshold voltage value less than the first hard bit read voltage $VR_1$ 242.

The soft bits may indicate results of comparing the threshold voltage of each particular cell (e.g., the first threshold voltage $V_1$ 230 and the second threshold voltage $V_2$ 232) to one or more soft bit thresholds (also referred to as soft bit read voltages) and may indicate whether the first threshold voltage $V_1$ 230 is greater than or less than the first soft bit read voltage (e.g., threshold $S_1$ 240). For example, the threshold voltage of the first storage element 113 and of the second storage element 115 may be compared to the first soft bit read voltage or threshold $S_1$ 240, to the second soft bit read voltage or threshold $S_2$ 244, and to the third soft bit read voltage or threshold $S_3$ 248. In addition, the soft bits may indicate whether the first threshold voltage $V_1$ 230 is greater than or less than the second soft bit read voltage $S_2$ 244, where the first soft bit read voltage $S_1$ 240 is less than the second threshold voltage $V_2$ 232, and where the second soft bit read voltage $S_2$ 244 is greater than the second threshold voltage $V_2$ 232.

The method 900 may be performed on a multi-cell rank modulation group, such as a three-cell rank modulation group. For example, the flash memory 104 may include a third cell (i.e., the storage element 117) having a third threshold voltage. The hard bit data may further indicate whether the third threshold voltage is in a first range of voltages that are less than the first threshold voltage $V_1$ 230 and the second threshold voltage $V_2$ 232, in a second range of voltages that are between the first threshold voltage $V_1$ 230 and the second threshold voltage $V_2$ 232, or in a third range of voltages that are greater than the first threshold voltage $V_1$ 230 and the second threshold voltage $V_2$ 232. The soft bit data may indicate whether the third threshold voltage is in one or more sub-ranges of the first range of voltages, the second range of voltages, or the third range of voltages.

The controller 106 may be configured to provide data read from the memory 104 to the rank modulation decoder 116. For example, the controller 106 may receive the data via a bus interface and may provide the received data to an input of the rank modulation decoder 116. The data may include the hard bits 260 and the soft bits 262. The rank modulation decoder 116 may be configured to logically partition the data into groups of bits, where each group of bits corresponds to a group of cells in the memory 104, and may rank cells of each particular group of cells according to cell threshold voltages to produce a cell ranking of the particular group of cells. For example, the mapper 220 may compare the first threshold voltage $V_1$ 230 and the second threshold voltage $V_2$ 232 and generate a ranking based on the comparison. The rank modulation decoder 116 may be configured to map each group of bits to a data value according to the cell ranking of the group of cells corresponding to the group of bits. For example, the mapper 220 may generate a data value based on a comparison of the first threshold voltage $V_1$ 230 and the second threshold voltage $V_2$ 232 and may send the data value based on cell ranking to the ECC engine 108 as the ECC codeword 270.

By providing data including hard bit data and soft bit data to a rank modulation decoder, error correction at the rank modulation decoder may be performed more quickly and/or accurately as compared to rank modulation decoding using hard bits only. As explained with reference to Table 2, cell information capacity may be increased by using rank modulation decoding using hard bits and soft bits as compared to rank modulation decoding using hard bits only.

Although various components depicted herein are illustrated as block components and described in general terms, such components may include one or more microprocessors, state machines, or other circuits configured to enable a data storage device, such as the data storage device 102 of FIG. 1, to perform the particular functions attributed to such components, or any combination thereof. For example, the rank modulation decoder 116 of FIG. 1 and FIG. 2 may represent physical components, such as controllers, processors, state machines, logic circuits, or other structures to logically partition the data into groups of bits, where each group of bits corresponds to a group of cells in a flash memory, to rank cells of each particular group of cells, and to map each group of bits to a data value according to the cell ranking of the group of cells corresponding to the group of bits.

The rank modulation decoder 116 may be implemented using a microprocessor or microcontroller programmed to generate data from rank modulated data using soft bits. In a particular embodiment, the controller 106 includes a processor executing instructions that are stored at the memory 104. Alternatively, or in addition, executable instructions that are executed by the processor may be stored at a separate memory location that is not part of the memory 104, such as at a read-only memory (ROM) (not shown).

In a particular embodiment, the data storage device 102 may be a portable device configured to be selectively coupled to one or more external devices. For example, the data storage device 102 may be a removable device such as a Universal Serial Bus (USB) flash drive or a removable memory card, as illustrative examples. However, in other embodiments, the data storage device 102 may be attached or embedded within one or more host devices, such as within a housing of a portable communication device. For example, the data storage device 102 may be within a packaged apparatus, such as a wireless telephone, a personal digital assistant (PDA), a gaming device or console, a portable navigation device, a computer, or other device that uses internal non-volatile memory. In a particular embodiment, the data storage device 102 includes a non-volatile memory, such as a Flash memory (e.g., NAND, NOR, Multi-Level Cell (MLC), Divided bit-line NOR (DINOR), AND, high capacitive coupling ratio (HiCR), asymmetrical contactless transistor (ACT), or other Flash memories), an erasable programmable read-only memory (EPROM), an electrically-erasable programmable read-only memory (EEPROM), a read-only memory (ROM), a one-time programmable memory (OTP), or any other type of memory.

The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments.

The above-disclosed subject matter is to be considered illustrative, and not restrictive, and the appended claims are intended to cover all such modifications, enhancements, and other embodiments, which fall within the scope of the present disclosure. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method comprising:
   providing data including hard bit data and soft bit data to a rank modulation decoder, wherein the rank modulation decoder is configured to:
   logically partition the data into groups of bits, wherein each group of bits corresponds to a group of cells in a flash memory;
   rank cells of each particular group of cells according to cell threshold voltages to produce a cell ranking of the particular group of cells; and
   map each group of bits to a data value according to the cell ranking of the group of cells corresponding to the group of bits.

2. The method of claim 1, wherein the data is read from multiple cells of the flash memory, wherein each particular cell of the multiple cells has a threshold voltage, and wherein the hard bit data includes hard bits that indicate results of comparing the threshold voltage of each particular cell of the multiple cells to one or more hard bit read voltages.

3. The method of claim 2, wherein the soft bit data includes soft bits that indicate results of comparing the threshold voltage of each particular cell of the multiple cells to one or more soft bit read voltages.

4. The method of claim 1, further comprising reading the hard bit data and the soft bit data from the flash memory.

5. The method of claim 4, wherein the flash memory includes a first cell having a first threshold voltage and a second cell having a second threshold voltage, and wherein the hard bit data indicates whether the first threshold voltage is greater than or less than the second threshold voltage.

6. The method of claim 5, wherein the soft bit data indicates whether the first threshold voltage is greater than or less than a first soft bit read voltage.

7. The method of claim 6, wherein the soft bit data further indicates whether the first threshold voltage is greater than or less than a second soft bit read voltage, wherein the first soft bit read voltage is less than the second threshold voltage, and wherein the second soft bit read voltage is greater than the second threshold voltage.

8. The method of claim 7, wherein a first difference between the first soft bit read voltage and the second threshold voltage is substantially equal to a second difference between the second threshold voltage and the second soft bit read voltage.

9. The method of claim 5, wherein the flash memory includes a third cell having a third threshold voltage, and wherein the hard bit data further indicates whether the third threshold voltage is in a first range of voltages that are less than the first threshold voltage and the second threshold voltage, in a second range of voltages that are between the first threshold voltage and the second threshold voltage, or in a third range of voltages that are greater than the first threshold voltage and the second threshold voltage, and wherein the soft bit data indicates whether the third threshold voltage is in one or more sub-ranges of the first range of voltages, the second range of voltages, or the third range of voltages.

10. A data storage device comprising:
    a memory;
    a rank modulation decoder; and
    a controller configured to provide data read from the memory to the rank modulation decoder, wherein the data includes hard bit data and soft bit data, wherein the memory is a flash memory and wherein the rank modulation decoder is configured to:
    logically partition the data into groups of bits, wherein each group of bits corresponds to a group of cells in the flash memory;
    rank storage elements of each particular group of storage elements according to storage element threshold voltages to produce a storage element ranking of the particular group of storage elements; and
    map each group of bits to a data value.

11. The data storage device of claim 10, wherein the data is read from multiple storage elements of the flash memory, wherein each particular storage element of the multiple storage elements has a threshold voltage, and wherein the hard bit data includes hard bits that indicate results of comparing the threshold voltage of each particular storage element to one or more hard bit read voltages.

12. The data storage device of claim 11, wherein the soft bit data includes soft bits that indicate results of comparing the threshold voltage of each particular storage element to one or more soft bit read voltages.

13. The data storage device of claim 11, wherein the multiple storage elements include a first storage element having a first threshold voltage and a second storage element having a second threshold voltage, and wherein the hard bit data indicates whether the first threshold voltage is greater than or less than the second threshold voltage.

14. The data storage device of claim 13, wherein the soft bit data indicates whether the first threshold voltage is greater than or less than a first soft bit read voltage.

15. The data storage device of claim 14, wherein the soft bit data further indicates whether the first threshold voltage is greater than or less than a second soft bit read voltage, wherein the first soft bit read voltage is less than the second threshold voltage, and wherein the second soft bit read voltage is greater than the second threshold voltage.

16. The data storage device of claim 15, wherein a first difference between the first soft bit read voltage and the second threshold voltage is substantially equal to a second difference between the second threshold voltage and the second soft bit read voltage.

17. The data storage device of claim 13, wherein the multiple storage elements include a third storage element having a third threshold voltage, and wherein the hard bit data further indicates whether the third threshold voltage is in a first range of voltages that are less than the first threshold voltage and the second threshold voltage, in a second range of voltages that are between the first threshold voltage and the second threshold voltage, or in a third range of voltages that are greater than the first threshold voltage and the second threshold voltage, and wherein the soft bit data indicates whether the third threshold voltage is in one or more sub-ranges of the first range of voltages, the second range of voltages, or the third range of voltages.

18. A method comprising:
providing data including hard bit data and soft bit data to a rank modulation decoder; and
reading the hard bit data and the soft bit data from a flash memory;
wherein the flash memory includes a first cell having a first threshold voltage and a second cell having a second threshold voltage, and wherein the hard bit data indicates whether the first threshold voltage is greater than or less than the second threshold voltage.

\* \* \* \* \*